United States Patent
Malinverni et al.

(10) Patent No.: US 10,600,934 B2
(45) Date of Patent: Mar. 24, 2020

(54) LIGHT EMITTING DEVICE WITH TRANSPARENT CONDUCTIVE GROUP-III NITRIDE LAYER

(71) Applicant: EXALOS AG, Schlieren (CH)

(72) Inventors: Marco Malinverni, Schlieren (CH); Marco Rossetti, Schlieren (CH); Antonino Francesco Castiglia, Schlieren (CH); Nicolas Pierre Grandjean, Schlieren (CH)

(73) Assignee: EXALOS AG, Schlieren (CH)

( * ) Notice: Subject to any disclaimer, the term of this patent is extended or adjusted under 35 U.S.C. 154(b) by 0 days.

(21) Appl. No.: 16/249,981

(22) Filed: Jan. 17, 2019

(65) Prior Publication Data
US 2019/0148587 A1    May 16, 2019

Related U.S. Application Data

(62) Division of application No. 15/429,603, filed on Feb. 10, 2017, now abandoned.

(30) Foreign Application Priority Data

Feb. 12, 2016  (CH) .................................... 191/2016

(51) Int. Cl.
*H01L 33/14* (2010.01)
*H01L 33/00* (2010.01)
(Continued)

(52) U.S. Cl.
CPC .......... *H01L 33/14* (2013.01); *H01L 33/0075* (2013.01); *H01L 33/32* (2013.01);
(Continued)

(58) Field of Classification Search
CPC ..... H01L 33/14; H01L 33/32; H01L 33/0075; H01L 33/145; H01L 33/007;
(Continued)

(56) References Cited

U.S. PATENT DOCUMENTS

| 5,048,035 A | 9/1991 | Sugawara et al. |
| 2008/0185608 A1 | 8/2008 | Chitnis |

(Continued)

FOREIGN PATENT DOCUMENTS

| DE | 4017632 A | 12/1990 |
| EP | 1403932 | 3/2004 |

OTHER PUBLICATIONS

Green Emission of Silicon Quantum Dot Light-emitting Diodes Caused by Enhanced Carrier Injection, Kim et al., Journal of the Korean Physical Society, V59, N3, Sep. 2011, pp. L2183-L2186.

*Primary Examiner* — Mohammed R Alam
(74) *Attorney, Agent, or Firm* — Law Office of Michael Antone; Michael Antone

(57) ABSTRACT

A group III-nitride semiconductor device comprises a light emitting semiconductor structure comprising a p-type layer and an n-type layer operable as a light emitting diode or laser. On top of the p-type layer there is arranged an n+ or n++-type layer of a group III-nitride, which is transparent to the light emitted from the underlying semiconductor structure and of sufficiently high electrical conductivity to provide lateral spreading of injection current for the light-emitting semiconductor structure.

18 Claims, 4 Drawing Sheets

(51) Int. Cl.
*H01L 33/32* (2010.01)
*H01S 5/042* (2006.01)
*H01S 5/30* (2006.01)
*H01S 5/183* (2006.01)
*H01S 5/223* (2006.01)
*H01S 5/323* (2006.01)
*H01S 5/20* (2006.01)

(52) U.S. Cl.
CPC .......... *H01L 33/325* (2013.01); *H01S 5/0421* (2013.01); *H01S 5/3013* (2013.01); *H01S 5/3063* (2013.01); *H01L 33/007* (2013.01); *H01L 33/145* (2013.01); *H01S 5/18341* (2013.01); *H01S 5/2068* (2013.01); *H01S 5/2231* (2013.01); *H01S 5/305* (2013.01); *H01S 5/3095* (2013.01); *H01S 5/32341* (2013.01); *H01S 2304/04* (2013.01)

(58) Field of Classification Search
CPC .. H01S 5/0421; H01S 2304/04; H01S 5/2068; H01S 5/32341; H01S 5/3095; H01S 5/305; H01S 5/2231; H01S 5/18341
See application file for complete search history.

(56) References Cited

U.S. PATENT DOCUMENTS

| | | |
|---|---|---|
| 2013/0048939 A1 | 2/2013 | Zhang |
| 2013/0215922 A1* | 8/2013 | Shimizu .............. H01S 5/18311 372/45.01 |
| 2013/0221320 A1 | 8/2013 | Li |
| 2014/0092391 A1 | 4/2014 | Matsuu et al. |
| 2015/0146749 A1 | 5/2015 | Hoshino et al. |
| 2016/0315221 A1 | 10/2016 | Chen et al. |
| 2017/0077348 A1 | 3/2017 | Lim |
| 2017/0200861 A1 | 7/2017 | Pfeuffer et al. |

* cited by examiner

LIGHT EMITTING DEVICE WITH TRANSPARENT CONDUCTIVE GROUP-III NITRIDE LAYER

This application is a divisional application of U.S. patent application Ser. No. 15/429,603 filed Feb. 10, 2017, which claims priority to and the benefit of Switzerland Patent Application No. CH 00191/2016 filed Feb. 12, 2016, both of which are incorporated herein by reference in their entireties.

The invention relates to the field of semiconductor-based light emitters and in particular to light emitters based on nitrides of group III elements. It relates to the devices themselves and also to methods for manufacturing such devices. Such devices can be or include, e.g., LEDs or lasers.

Definition

"Vertical" in the present description denotes directions in which layer growth takes place. In usual wafer level manufacturing techniques, vertical directions are aligned perpendicular to the plane described by the wafer.

"Lateral" in the present description denotes directions which are perpendicular to vertical directions, i.e. denotes directions parallel to the wafer plane.

At the end of the last century, high efficiency light emitting diodes and laser diodes with UV and visible emission have been developed which are based on layers of p-type Mg doped nitrides of group-III elements. For brevity, we shall use "III-nitride" as a shorthand for "nitride of one or more group-III elements." Such devices have nowadays become ubiquitous and find use, e.g., in solid-state lighting, in data storage, in projection applications and in industrial applications. Therefore, devices herein described can find applications in these fields, too.

However, Mg-doped III-nitride layers are complicated to deal with due to the fact that the dopant, i.e. Mg, has a high activation energy (low hole concentrations despite high Mg concentrations) and since activation/passivation of the Mg dopant is accomplished by heat treatments and by interaction with hydrogen, respectively. Mg-doped III-nitride layers frequently have a high resistivity, e.g., in light-emitting p-i-n junctions. And control of the quality of metallic or semitransparent conductive contacts to the layers is difficult.

An object of the present disclosure is to describe ways of achieving a particularly high conversion efficiency, i.e. having a particularly high light output per inputted electrical energy, as well as to describe corresponding devices.

Another object of the present disclosure is to describe ways of achieving a particularly high-intensity light emission, as well as to describe corresponding devices.

Another object of the present disclosure is to describe ways of achieving very homogeneous current spreading, in particular lateral current spreading, of injection currents for light emission, as well as to describe corresponding devices.

Another object of the present disclosure is to describe ways of achieving particularly low contact resistances towards electrical contacts of devices and/or towards a semiconductor layer of a light-emitting semiconductor structure of a device, as well as to describe corresponding devices.

Another object of the present disclosure is to describe ways of achieving a high transparency of layers through which light is emitted from a light-emitting semiconductor structure, as well as to describe corresponding devices.

Another object of the present disclosure is to describe ways of achieving a high light emission density, as well as to describe corresponding devices.

In addition, methods for manufacturing respective devices shall be described.

Further objects and various advantages emerge from the description and embodiments below.

At least one of these objects is at least partially achieved by devices and methods according to the patent claims.

A device is described which comprises
  a semiconductor structure which is operable to emit light and which comprises a first layer and a second layer; and in addition,
  a transparent layer of a nitride of one or more group-III elements, which is transparent to light emitted from the semiconductor structure.

The transparent layer is present on the first layer. Thus, the transparent layer and the first layer can share a common interface. E.g., the transparent layer and the first layer can be in direct contact, e.g., the transparent layer can be deposited directly on the first layer. The transparent layer can be present on the first layer (such as on a portion of the first layer) with no further layer present between them (in the range of said portion).

Furthermore, the transparent layer can have a low resistivity.

The transparent layer can have a resistivity so low that it can be considered an electrically conductive layer. The resistivity of the transparent layer can be, e.g., below $5 \cdot 10^{-4}$ $\Omega$cm or even below $2 \cdot 10^{-4}$ $\Omega$cm. In instances, the resistivity of the transparent layer is at most $1 \cdot 10^{-4}$ $\Omega$cm.

The electrical conductivity of the transparent layer can exceed the conductivity of the first layer by a factor of at least 10, e.g., of at least 50. In instances, the electrical conductivity of the transparent layer exceeds the electrical conductivity of the first layer by a factor of at least 100.

The very high conductivity (or equivalently: low resistivity) of the transparent layer can result in excellent (lateral) current spreading properties of the transparent layer. Holes in p-doped III-nitride layers have large effective mass, which results in a typically lower mobility if compared to n-doped layers. Furthermore, Mg (which apparently is the only known p-dopant to date) is a deep acceptor, and only a small fraction of the atoms in the crystal are ionized to provide holes in the valence band. And in addition, there is a physical limit to the quantity of Mg that can be introduced into a III-nitride layer above which the magnesium does not function as p-dopant anymore, because above a certain limit, the impurity atoms form aggregates and other large defects so that at least a portion of the introduced Mg does not function as p-dopant anymore. Thus, according to today's understanding, it is not possible to make very low resistivity p-layers in III-nitride materials. Low resistivity n-doped III-nitride layers, however, are well producible.

The transparent layer can be provided for injecting charge carriers into the first layer or for receiving charge carriers from the first layer.

The transparent layer can be a layer of a nitride of, e.g., one or more of Ga, Al, In.

The transparent layer can be transparent to UV light and/or to visible light.

The light emittable from the semiconductor layer can be UV light or visible light.

The device can be a light emitting device. It can be, e.g., an edge emitting semiconductor device such as an edge emitting laser, a vertical cavity surface emitting laser (VCSEL), a light emitting diode (LED), an RCLED (resonant cavity LED).

The semiconductor structure can be, e.g., any known light-emitting semiconductor structure, such as a p-i-n layer stack (p-doped layer, intrinsic layer, n-doped layer) or a p-n layer stack (p-doped layer, n-doped layer).

In some embodiments, the first and second layers are doped semiconducting layers.

The first layer can be of a first doping type and the second layer of a second, opposite doping type. I.e. the first layer can be p-type (i.e., p-doped), while the second layer is n-type (i.e., n-doped). Or, vice versa, the first layer can be in other embodiments n-type (i.e. n-doped), while the second layer is p-type (i.e., p-doped).

Throughout the present description, mostly the case is described that the first layer is p-type and the second layer is n-type. And, in addition, mostly, Mg is mentioned as p-type dopant for the first layer. However, it can be vice-versa, too, and corresponding n-type dopants can be, e.g., Si or O or Ge.

The semiconductor structure has an active region in which the light is generated. In case of a p-i-n structure, the active region coincides with the i-layer; in case of a p-n structure, the active region coincides with the interface between the p-doped and the n-doped layer.

In some embodiments, the first layer is a III-nitride. E.g., it can comprise the same III-nitride as the transparent layer does. E.g., if the transparent layer is made of $Al_xGa_yIn_{1-x-y}N$ (with $0 \leq x \leq 1$; $0 \leq y \leq 1$), also the first layer can be made of $Al_xGa_yIn_{1-x-y}N$ (with identical x and y). Also, the second layer and/or (if present), to an i-layer between the first and second layer can be a III-nitride layer.

In some embodiments, the semiconductor structure is an epitaxial structure, e.g., a homoepitaxial layer stack. E.g., the first layer, the second layer and, if present, an i-layer between the first and second layer can all be layers made of $Al_xGa_yIn_{1-x-y}N$ (with $0 \leq x \leq 1$; $0 \leq y \leq 1$), with different or with the same x and y, but usually differing in their respective dopants and/or dopant concentrations.

Furthermore, e.g., in addition, the transparent layer can be an epitaxial with the first layer, in instances even a homoepitaxial layer. It can be of the same doping type or of the opposite doping type.

Epitaxial layers can show a high crystal quality and can thus have low resistivities and high degrees of transparency. Moreover, layer-to-layer interface resistances can be particularly low.

However, in general, the transparent layer can alternatively have a different crystallinity and, e.g., be a polycrystalline layer.

In some embodiments, light produced in the semiconductor structure is emitted through the transparent layer. This can facilitate the manufacture of top-emitting devices such as VCSELs.

In some embodiments, the device comprises a substrate, the second layer being arranged between the substrate and the first layer. It is, however, also possible to manufacture the device without an additional substrate and/or to provide a substrate (with the second layer being arranged between the substrate and the first layer) during some manufacturing steps and to remove the substrate in a later processing step.

The semiconductor structure can be produced in any known way. E.g., the semiconductor structure can be produced by MOVPE (Metal Organic Vapor Phase Epitaxy). Or, at least the first layer is produced by MOVPE. If the semiconductor structure comprises an i-layer, at least the i-layer and, e.g., also the first layer, can be produced by MOVPE.

MOVPE is also known as, MOCVD (Metal Organic Chemical Vapor Deposition).

When a p-doped (such as an Mg doped) p-layer is produced by MOVPE, e.g., as the first layer, the dopant can be present in a passivated state, e.g., due to the presence of H (hydrogen in the layer). In order to activate the dopant (e.g., Mg), a heat treatment (also referred to as "annealing") can be applied, e.g., by heating to a temperature between 400° C. and 900° C.

In some embodiments, the transparent layer is deposited after an activation step has been accomplished in which passivated dopant present in the first layer is activated, e.g., in an above-described way.

For depositing the transparent layer, a deposition technique can be used which is different from the deposition technique used for depositing the first layer.

This can avoid contributing to a passivation of dopant present in the first layer, e.g., if the dopant can be passivated by H, a technique can be used in which the first layer is not exposed to H.

The transparent layer can be produced by, e.g., MBE (Molecular Beam Epitaxy).

Alternatively, however, other deposition techniques, e.g., vacuum deposition techniques (in particular chemical vapor deposition techniques or physical vapor deposition techniques), can be used, such as sputtering, atomic layer deposition, pulsed laser deposition.

On the other hand, MBE can make possible epitaxial, e.g., homoepitaxial, growth of the transparent layer. This can result in very low resistivities and interface resistances and good transparency.

The transparent layer can, accordingly, be "regrown" on the first layer.

Low resistances at interfaces between the first layer and the transparent layer can be achieved when the transparent layer adopts the lattice structure and lattice constant from the first layer.

The transparent layer can have a high degree of crystallinity, which can result in a low percentage of non-radiative recombination and thus in high conversion efficiency. E.g., a full-width at half maximum (FWHM) of an Omega rocking curve in X-ray diffraction can be below 2° or rather below 1°.

The low resistivities of the transparent layer mentioned above can be achieved by high point defect concentrations in the transparent layer. The point defects can be vacancies (i.e., missing atoms in the lattice) or can be impurities such as foreign atoms in the lattice, which can be, e.g., dopants. Point defect concentrations in the transparent layer can be, e.g., at least $5 \cdot 10^{19}/cm^3$. They can be, e.g., up to $1 \cdot 10^{21}/cm^3$. In some embodiments, the point defect concentration in the transparent layer is between $5 \cdot 10^{19}/cm^3$ and $5 \cdot 10^{20}/cm^3$.

The foreign atoms in the lattice of the transparent layer can be one or more of Si, O, C, Mg, Be, Ge, Zn, Ti.

In some embodiments, the first layer is a p-doped layer, e.g., with Mg as dopant, and the transparent layer is an n-doped layer, e.g., doped with Si and/or with O. But also other foreign atoms may be present (cf. above).

In some other embodiments, the first layer and the transparent layer are both p-doped layers, e.g., both with Mg as dopant.

For n-type transparent layers, it is, with technologies currently at hand, easier to achieve high conductivities than for p-type layers, as has been explained above.

The transparent layer can be used for efficient injection of charge carriers from the transparent layer into the first layer or from the first layer into the transparent layer, in response to application of an electric field across the transparent layer and the first layer. The electric field can extend across the semiconductor structure and the transparent layer.

The transparent layer and the first layer are, in some embodiments, in direct contact with each other (and thus form a common interface) over the full lateral extension of the transparent layer and/or of the first layer.

In order to better define the current flow in the semiconductor structure, however, a current aperture stop can be provided. This can also be beneficial if one or more electrical contacts are provided on one or more portions of the transparent layer, in particular in case a precision with which the electrical contact(s) are laterally positioned is low, e.g., is lower than a precision with which the current aperture stop can be laterally positioned.

Thus, as an option, the device can comprise a current aperture stop between a portion of the semiconductor structure and a portion of the transparent layer. In a lateral area defined by the corresponding aperture (i.e., by the opening defined by the current aperture stop), the first layer and the transparent layer establish their common interface which has been mentioned above already. In this case, the common interface can be, e.g., extended also across a portion of the transparent layer and, in instances, also across a portion of the first layer.

The current aperture stop can be provided for confining electrical currents flowing from the transparent layer through the first layer into the active region or vice versa.

In some embodiments, the current aperture stop laterally encircles a portion of the first layer. In particular, it can do so in a common vertical range in which both, the current aperture stop and the first layer are present.

For particularly low resistivity and high transparency of the transparent layer, the transparent layer can be epitaxially (and even homoepitaxially) grown on the current aperture stop, as this can result in particularly good crystallinity of the transparent layer.

The current aperture stop can be epitaxially or even homoepitaxially with the first layer. This can be achieved in various ways some of which will be explained.

In some embodiments, the current aperture stop is (e.g., epitaxially) grown on the first layer.

In some embodiments, the current aperture stop is created in the first layer. This can be accomplished, e.g., without having to grow another layer establishing the current aperture stop. E.g., impurity concentrations such as, e.g., co-dopant concentrations, can be locally changed in order to produce the current aperture stop and/or a status (activated or passivated) of a dopant in the first layer can be locally changed in order to produce the current aperture stop in the first layer.

It is also possible, e.g., to grow (e.g., regrow) on a layer of the semiconductor structure, such as on the first layer, a resistive material (i.e., a material having a resistivity exceeding the resistivity of the first layer to establish the current aperture stop), possibly after etching of at least a part of the first layer in a lateral region where the current aperture stop shall be established.

This will be described in more detail below.

The current aperture stop can be made of a (relatively) high resistivity material. E.g., material comprised in the current aperture stop can have a resistivity of at least 10 times the resistivity of the first layer, or even of at least 100 times the resistivity of the first layer. E.g., material comprised in the current aperture stop can have a resistivity of at least $5 \cdot 10^{-2}$ Ωcm or even of at least 1 Ωcm.

By means of the current aperture stop, a current effecting the light emission in the semiconductor structure can be confined and/or the light emission from the semiconductor structure can be confined.

The before-mentioned common interface of the transparent layer and the first layer can be surrounded, e.g., be fully encircled, by the current aperture stop.

In some embodiments, the current aperture stop is present between the transparent layer and the first layer (laterally outside an area taken by said common interface). This way, e.g., the first layer can have its full lateral extension where it is close to the active region of the semiconductor structure. This can result in a high light output.

In some embodiments, the current aperture is present between an active region of the semiconductor structure and the transparent layer (laterally outside an area taken by said common interface). This way, e.g., active region (such as an i-layer of the semiconductor structure or the p-n-interface in case of a semiconductor structure of p-n type) can have its full lateral extension. This can result in a high light output.

For particularly low resistivity of the transparent layer in (lateral) regions where the transparent layer interfaces the current aperture stop, it can be beneficial to have the current aperture stop epitaxially (or even homoepitaxially) with the first layer and/or to have the transparent layer epitaxially (or even homoepitaxially) with the current aperture stop.

When the current aperture stop is epitaxial with the first layer, the base on which the transparent layer is deposited can have the same crystal properties where the first layer establishes said base (i.e. in the lateral region of the current aperture) and where the current aperture stop establishes said base. Accordingly, a low defect density can be achieved not only where the transparent layer interfaces the current aperture stop and where it interfaces the first layer, but also where the current aperture stop abuts the current aperture.

In some embodiments, the transparent layer laterally overlaps the current aperture stop. One or more electrical contacts of the device (for applying currents for effecting the light emission) can furthermore be present in a lateral region defined by this overlap, whereas the one or more electrical contacts can furthermore be free from lateral overlap with the current aperture. This way, light blocking by electrical contacts can be avoided, in particular in case of top emission (through the current aperture, through the transparent layer).

Producing the current aperture can be accomplished, e.g., in one of the following ways:

In a first embodiment, a dopant in the first layer is selectively activated. This implies that before establishing the current aperture stop, the first layer contains a passivated dopant. This can be the case because of the way the first layer is produced. E.g., in case of a III-nitride layer which is p-doped by Mg and produced in such a way that the Mg atoms are passivated by H (hydrogen), as it is the case, e.g., when such a layer is conventionally produced by means of MOVPE. Or, a passivated dopant can be produced, e.g., by applying an additional process step in which the dopant (which previously was not passivated) is passivated.

E.g., a diffusion-inhibiting mask can be selectively deposited on the first layer in the (lateral) region(s) where the current aperture stop shall be established, and then passivating atoms are removed from the non-masked region(s) of the first layer such as by diffusion, e.g., promoted by a heat treatment such as by heating to above 450° C. This way, a thickness of the current aperture stop identical with the thickness of the first layer can be achieved. Before applying the transparent layer, the diffusion-inhibiting mask can be removed.

In the first embodiment, but also in second and third embodiments, device portions can be produced (namely the current aperture stop and the first layer portion establishing the current aperture) which are located laterally next to each other (e.g., abutting each other) and located on the same vertical level, and which have different resistivities. In case of the first embodiment, they can have strongly different concentrations of passivated and activated dopant. E.g., while in the current aperture, more than 40% or even more than 50% of the doping atoms are activated, in the current aperture stop, less than 5% of the doping atoms are activated.

In a second embodiment, a portion of the first layer (with activated dopants) is converted into the current aperture stop by increasing a resistivity therein by locally introducing impurities (foreign atoms) into the first layer. The foreign atoms can be co-dopants, such as n-dopants, e.g., Si or O or Ge, in case the first layer is a p-layer, e.g., with Mg as dopant, or can be atoms which passivate the dopant(s) in the first layer, such as H atoms in III-nitrides which are p-doped by Mg. Or they can be other types of atoms such as Ti, Ar, C, Cl which increase resistivity, e.g., of III-nitrides which are p-doped by Mg, by mechanisms which are today partially not yet completely understood.

In case the dopant(s) in the first layer is (are), after deposition, initially passivated, e.g., by H atoms passivating Mg atoms as dopant (cf. the example above with p-doped III-nitride), the dopant(s) can be activated before the local introduction of impurities into the first layer. This can be accomplished, e.g., by the before-mentioned heat treatment.

In instances, a thickness of a current aperture stop produced in the second embodiment can be smaller than a thickness of the first layer; and accordingly in this case, the current aperture layer can be located between the first layer and the transparent layer.

In one variant of the second embodiment, a diffusion-promoting mask is locally applied to regions where the current aperture stop shall be established, wherein the mask contains said impurity atoms. By diffusion of the impurity atoms from the mask into the first layer, the current aperture stop is created. In order to promote the diffusion of the impurity atoms into the first layer, a heat treatment such as heating to above 100° (and, optionally below 450° C.) can be applied. Examples for diffusion-promoting masks are masks containing Ti (for Ti as impurities), masks containing Ge (for Ge as impurities), masks containing SiN (for Si as impurities), masks containing $SiO_2$ (for Si and/or O as impurities). Before applying the transparent layer, the diffusion-promoting mask can be removed.

In another variant of the second embodiment, a diffusion-inhibiting mask can be selectively deposited on the first layer in the (lateral) region where the current aperture shall be established, and then, impurities such as H, O, C, Si, Cl, Ar can be introduced into the first layer—in the region(s) not protected by the diffusion-inhibiting mask and thus in the region(s) where the current aperture stop shall be established. E.g., a plasma can be applied which contains one or more types of the impurity atoms. The plasma can be applied, e.g., at between 0.001 mbar and 0.2 mbar (or between 1 mTorr and 100 mTorr) pressure and at plasma power supply voltages between 50 V and 500 V. Before applying the transparent layer, the diffusion-inhibiting mask can be removed.

In a third embodiment, material of the current aperture stop is deposited on a portion of the semiconductor structure, e.g., on the first layer, so as to form the aperture stop, e.g. by means of MBE. The material of the current aperture stop has a resistivity which is relatively higher than the resistivity of the first layer. The material can be, e.g., intrinsic (non-intentionally doped) semiconductor material (e.g., a III-nitride) or co-doped material, e.g., containing a p-dopant such as Mg and one or more n-dopants such as Si, O. If in the deposition of the current aperture stop, material is also deposited in the (lateral) region of the current aperture such as on a removable mask present there, such material can be removed by removing the removable mask, e.g., in a lift-off technique.

The material of the current aperture stop in the third embodiment can be epitaxial and in particular even homoepitaxial with the material of the first layer.

Also for the third embodiment applies that in case the dopant(s) in the first layer is (are), after deposition, initially passivated, e.g., by H atoms passivating Mg atoms as dopant (cf. the example above with p-doped III-nitride), the dopant(s) can be activated before the local introduction of impurities into the first layer. This can be accomplished, e.g., by the before-mentioned heat treatment.

In a first variant of the third embodiment, prior to depositing the material of the current aperture stop, a portion of the first layer is removed in the (lateral) region(s) where the current aperture stop shall be established, e.g., by etching such as ion etching, e.g., with Cl ions. It is even possible to completely remove the first layer. In order to protect the (lateral) region(s) where the current aperture shall be located, a protective mask such as an etch-protective mask (which can be identical with or, alternatively, different from the removable mask mentioned above) can be applied to the first layer in said region(s). Then, material of the current aperture stop is deposited, so as to form the aperture stop, e.g. by means of MBE. This way, it is possible to achieve that a surface of the current aperture stop on which the transparent layer will be deposited lies in one and the same (lateral) plane as a surface of the first layer on which the transparent layer will be deposited. This can contribute to minimizing dislocations in the transparent layer.

In a second variant of the third embodiment, no removal of material from the first layer takes place prior to depositing the material of the current aperture stop. This way, the surface on which the transparent layer will be deposited can be a non-planar surface, but has a higher portion (on the current aperture stop) and a lower portion (on the first layer where it establishes the current aperture). Accordingly, the transparent layer can have a curved cross-section. This can, in instances lead to a somewhat increased density of dislocations of the transparent layer.

In the context of the present patent application, it is assumed that variations in a ratio of activated and passivated dopants and variations in point defect concentrations (such as concentrations of foreign atoms and/or concentrations of dopants and/or co-dopants) do not show an effect on lattice parameters such as on the crystal structure and/or on the lattice constant, at least for point defect densities up to $2 \cdot 10^{21}/cm^3$.

In some embodiments, all layers of the semiconductor structure are III-nitride layers.

In some embodiments, all layers of the current aperture stop are III-nitride layers. The current aperture stop can be constituted by a single structured layer.

In some embodiments, all layers of the transparent layer are III-nitride layers. The transparent layer can be constituted by a single III-layer.

A composition of any of the III-nitride layers, in particular of those of the semiconductor structure, can vary along the vertical axis. E.g., parameters x and y in $Al_xGa_yIn_{1-x-y}N$ (with $0 \leq x \leq 1$; $0 \leq y \leq 1$) can vary along the growth axis in the first and/or in the second layer. It is noted that III-nitride layers can be epitaxially grown on each other even if they have different compositions in this sense.

In case the semiconductor structure includes an i-layer (not intentionally doped layer), the i-layer can comprise quantum wells.

In some embodiments, dopant concentrations in layers of the device, in particular in the first and/or in the second layer, can vary along the vertical axis.

The transparent layer can be used as a vertical injector, i.e. as a layer via which current is vertically guided. Resistances to electrical contacts (such as to metallic layers) can be minimized this way.

And/or the transparent layer can be used as a horizontal current spreading layer, so as to ensure a good lateral distribution of currents flowing through the semiconductor structure.

The transparent layer can be used as an efficient transparent current injector.

The transparent layer can be deposited after activation of a dopant in the first layer grown by MOVPE such as a p-dopant, e.g., Mg. The transparent layer can contain high levels of impurity atoms (e.g. silicon, oxygen, carbon, magnesium, beryllium, germanium, zinc) or other point defects (e.g., vacancies in the lattice structure of the III-nitride, e.g., N-vacancies) and can be mono- or poly-crystalline depending on technology and parameters used for growth/deposition. Epitaxial monocrystalline III-nitride (which, however, can contain some degree of dislocations and of point defects) can make possible to achieve particularly low resistivities.

In some embodiments, the current aperture laterally overlaps with an active region of the semiconductor layer.

In some embodiments, the device comprises a first electrical contact (which is electrically conductive, e.g., metallic) and a second electrical contact (which is electrically conductive, e.g., metallic): The first electrical contact can be present on (an be in direct contact with) the transparent layer.

When an electric voltage is applied across the device, e.g., via electrical contacts of the device, charge carriers move in the following sequence (or vice versa) through the following constituents of the device: transparent layer, first layer, (if present: i-layer between first and second layer), second layer.

We also describe a method for manufacturing a device, wherein the device comprises
- a semiconductor structure operable to emit light from an active region of the semiconductor structure and comprising a first layer and a second layer; and in addition,
- a transparent layer of a nitride of one or more group-III elements, which is transparent to light emitted from the semiconductor structure and which has an electrical conductivity exceeding an electrical conductivity of the first layer;
- and the method comprises producing, e.g., depositing, the transparent layer on the first layer.

The device can be, e.g., any device herein described.

The first layer can be produced using metal organic vapor phase epitaxy (MOVPE). Also the second layer and, if present another layer between the first and the second layer such as a non-intentionally doped layer can be produced by MOVPE.

The transparent layer, however, can be produced in a technique different from MOVPE and in particular in a technique in which the first layer is not exposed to hydrogen, such as using molecular beam epitaxy.

More details and embodiments relating to the method are described above and below.

Transparent layers can be produced which have the before-mentioned common interface with the first layer and which share an interface with the current aperture stop, wherein the latter interface and said common interface are in one and the same plane. This way, the number of dislocations in the transparent layer can be very small which can result in low resistivities and/or high transparency.

Further embodiments and advantages emerge from the dependent claims and the figures.

BRIEF DESCRIPTION OF THE DRAWINGS

Below, the invention is described in more detail by means of examples and the included drawings. The figures show schematically in a cross-sectional view.

DETAILED DESCRIPTION OF THE INVENTION

The described embodiments are meant as examples or for clarifying the invention and shall not limit the invention.

We describe in several examples a transparent and conductive III-nitride layer (herein also referred to as TCN layer or transparent layer) that can be present, e.g., on an uppermost Mg-doped layer of a III-nitride p-i-n junction grown by, e.g., conventional MOVPE.

Figure 1:
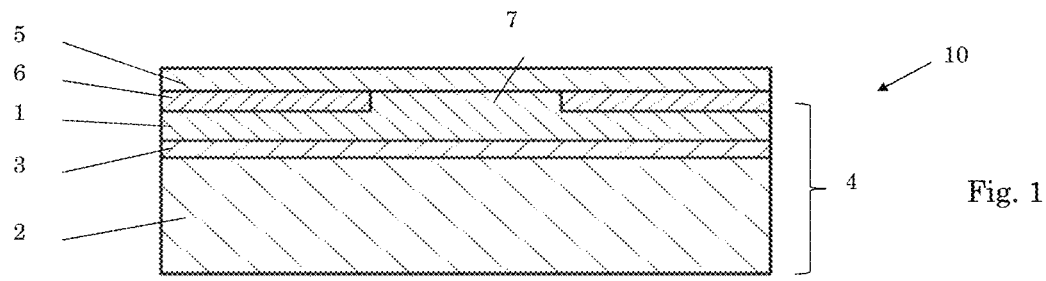
FIG. 1 a device comprising a TCN layer and a current aperture stop.

FIG. 1 illustrates schematically such a device 10 in a cross-sectional view.

Even though p-i-n type semiconductor structures are illustrated through most of the present description, corresponding embodiments with p-n type semiconductor structures are also possible embodiments.

The TCN layer 5, grown as a monocrystalline layer (e.g. by MBE or MOVPE) or deposited as a polycrystalline layer (e.g., by sputtering, evaporation or atomic layer deposition), provides very low resistivity, in particular to metallic contacts, and offers excellent transparency to UV and/or visible light. The TCN layer 5 has a high concentration of impurities (like for example silicon, oxygen, carbon, magnesium, beryllium, germanium, zinc atoms) or other types of point defects, like for example Nitrogen vacancies.

The semiconductor structure 4 is a p-i-n structure, e.g., grown by MOVPE. The p-doped layer 1 is also referred to as first layer 1, the n-doped layer 2 is also referred to as second layer 2, and the layer 3 in between can be an i-layer, i.e. a non-intentionally doped layer.

Semiconductor structure 4 is post-growth thermally annealed to activate the p-dopant in the first layer 1, i.e. to remove hydrogen bonded to the Mg dopant, and it can be also processed by conventional techniques (photolithography, etching, plasma passivation, ion implantation, etc.), e.g., to optionally create a current aperture 7 defined by a current aperture stop 6 before the growth/deposition of the TCN layer 5.

III-nitride based p-i-n structures 4 grown by MOVPE are current technology required for producing highly efficient and long-lifetime light-emitting diodes and laser diodes with emission in the UV or visible part of the spectrum. Despite the strong degree of development that such structures have experienced over the last 20 years, some aspects related to the quality of the contact layers, in particular to the p-side of the junction, remain unsolved. The present description relates i.a. to the following aspects:

Low values for the specific resistance of metallic contacts provided for current injection to the p-doped layers, even though highly desirable, are difficult to achieve. Most values reported in literature lie in the high $10^{-4}$ $\Omega \cdot cm^{-2}$ or even $10^{-3}$ $\Omega \cdot cm^{-2}$ range for metallic contacts deposited over Mg-doped GaN in light-emitting diodes with visible emission. UV-emitters with aluminium-containing uppermost layers suffer from even worse resistances. This resistance has a direct impact on the current-voltage (I-V) characteristics of the final device, and also impacts the electric-to-optic power conversion efficiency.

Figure 2A:
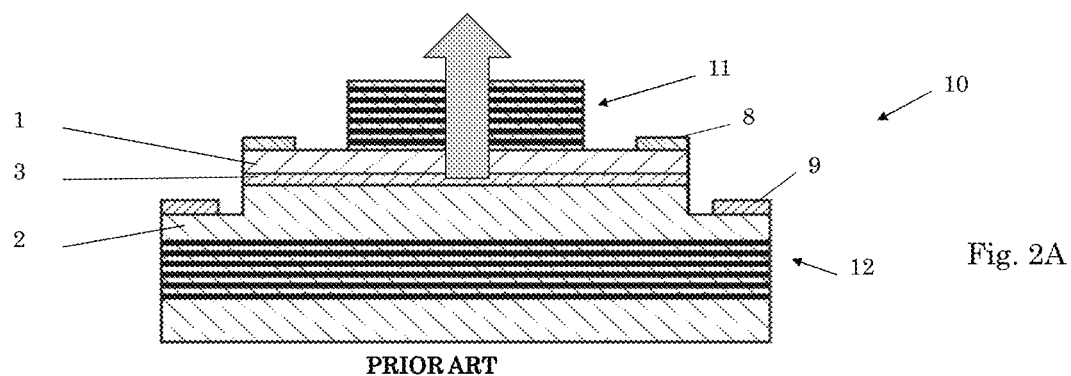
FIG. 2A a prior art GaAs-based VCSEL.
Figure 2B:
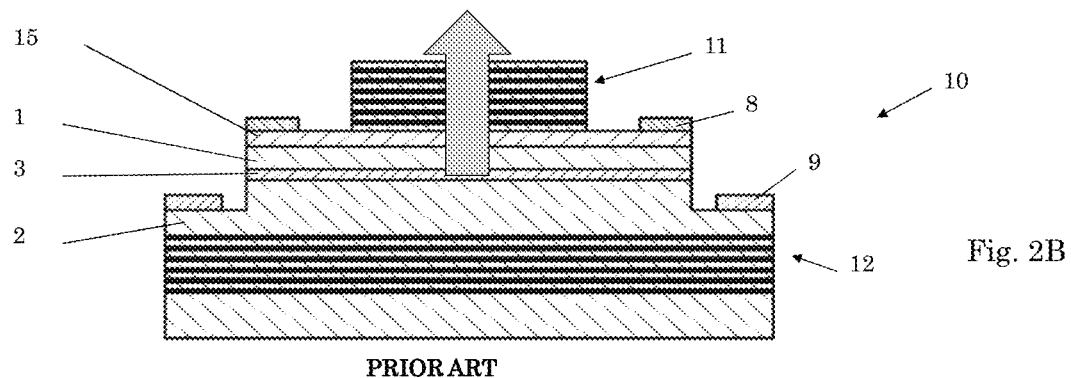
FIG. 2B a prior art GaAs-based VCSEL with TCO current spreading layer.

The known Mg-doped p-layers themselves have a considerable resistivity, which apparently renders impossible in known technology the realization of device geometries with lateral injection (current flowing along a lateral direction, i.e. in-plane), as it can be for example desirable for intracavity Vertical Cavity Surface Emitting Laser (VCSEL) contacts in the GaAs material system. FIG. 2A illustrates a prior art GaAs-based VCSEL. Metal contacts are referenced 8 and 9, reflectors are referenced 11 and 12. The open arrow indicates the direction of light emission. This limitation has been overcome in prior art by the use of transparent conductive oxide layers (TCO) that can provide a decent specific resistance to the uppermost p-layer 1 in the epitaxial structure (e.g., 4 to 9 times $10^{-4}$ $\Omega \cdot cm^{-2}$). And at the same time, it can offer a certain degree of transparency. FIG. 2B illustrates such a device with a TCO layer 15. Despite strong development efforts and use of such semi-transparent layers, it is a challenge in prior art to provide contact layers that are better matched to the uppermost p-layer 1 of the epitaxial structure and that at the same time offer a high degree of transparency.

We herein describe the use of a III-nitride layer (in particular AlInGaN with any possible composition of Al, In and Ga atoms) that is deposited, e.g., regrown or epitaxially grown on, e.g., a conventional p-i-n structure produced by MOVPE.

The as grown MOVPE structure comes with p-layers that are not active due to the magnesium being bond to hydrogen atoms that are widely present in the epitaxial growth environment. In order to achieve current injection and to properly operate the device, the p-dopant is activated by post-growth thermal annealing and hydrogen segregation from the structure resulting therefrom. The activation of the p dopant can be performed, e.g., either in-situ inside the MOVPE-growth equipment or ex-situ in a thermal annealing oven. After the activation of the Mg dopant, the semiconductor structure 4 can be processed to create one or more current apertures and then produce the TCN layer 5 (cf. FIG. 1), or the TCN layer 5 can be produced directly on first layer 1. The latter case with no current aperture is illustrated in FIG. 3.

Figure 3:
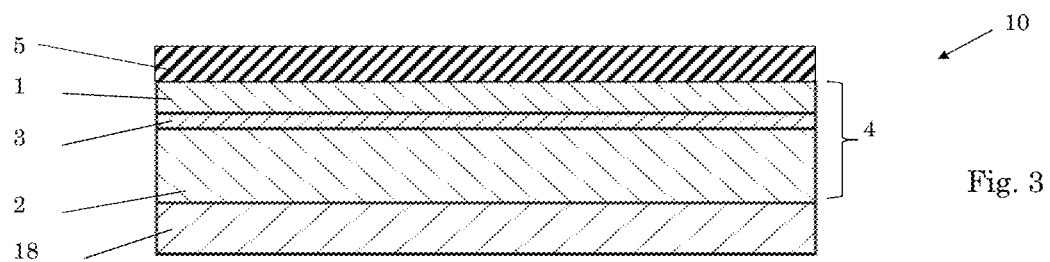
FIG. 3 a device without current aperture.

In FIG. 3 is also shown that the semiconductor structure 4 can be (in any embodiment) present on a substrate 18.

The TCN layer, e.g., a highly Si-doped GaN layer, can be grown by MBE, e.g., over a conventional p-i-n structure 4. Nevertheless, other growth or deposition techniques such as MOVPE, sputtering, evaporation can, in instances be used, too. In contrast to MOVPE as usually applied, MBE can be carried out in a hydrogen-free environment. Therefore, using MBE or other hydrogen-free techniques for depositing the TCN layer 5 can prevent that Mg which is already present (in the first layer 1) is deactivated (by hydrogen present during deposition of the TCN layer 5). Moreover, the TCN layer 5 can be epitaxially grown over the existing structure (which includes the first layer 1 and, if present, also the current aperture stop 6) and thus offers an excellent crystalline purity and can therefore be designed for very high transparency to the light emitted from the active region of the underlying semiconductor structure 4, i.e. from the i-layer in case of a p-i-n structure 4.

Light emitting diodes (LEDs) and laser diodes (LDs) can be designed with the TCN layer 5, e.g., regrown by means of MBE. On such devices, the inventors already have achieved contact resistances as low as $1 \cdot 10^{-6}$ $\Omega \cdot cm^{-2}$ (which is two orders of magnitude lower than in conventional devices without TCN layer 5), while no adverse effect on the optical performance or quality of the devices has been found.

On the TCN layer 5 of the device 10, one or more electrical contacts (such as prior art contact 8, cf. FIGS. 2A, 2B) can be applied.

Examples of Possible Device Designs Including a TCN Layer 5

The device 10 can be, e.g., one of the devices sketched in the following. The meaning of the reference symbols can be inferred from the previous Figures, where not explicitly explained. The open arrows indicate directions of light emission. Electrical contacts 8, 9 can be metallic contacts.

Figure 4:
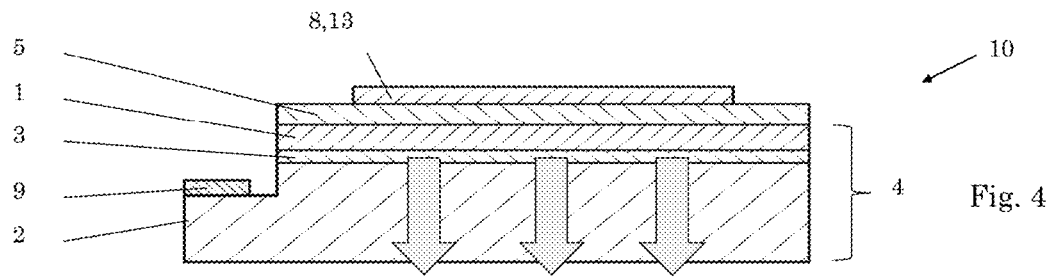
FIG. 4 a flip chip LED device comprising a TCN layer.
Figure 5A:
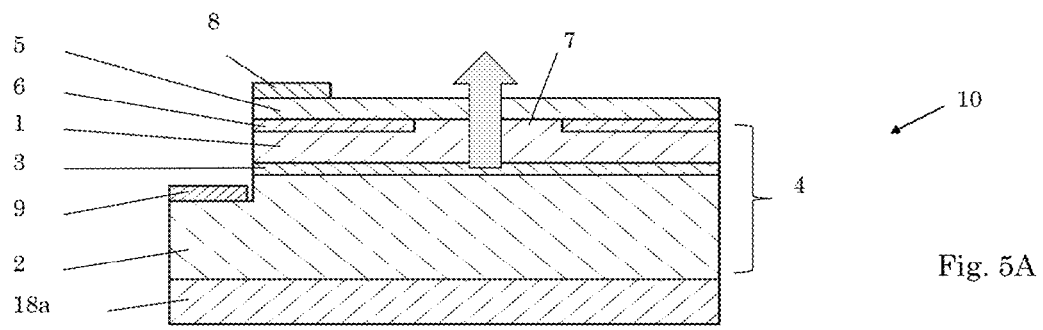
FIG. 5A an LED device comprising a TCN layer and current aperture stop, with non-conductive substrate.
Figure 5B:
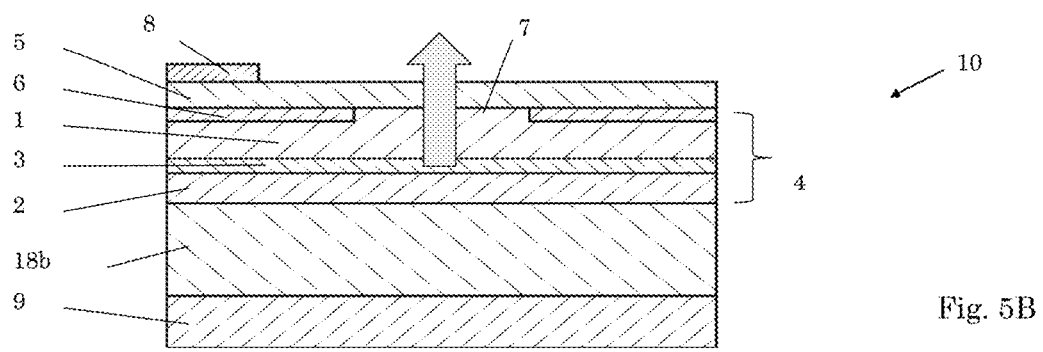
FIG. 5B an LED device comprising a TCN layer and current aperture stop, with conductive substrate.

Light Emitting Diode a. FIG. 4 illustrates flip chip device 10: Herein, the TCN layer 5 can contribute to minimizing the resistance to the electrical contact 8 which is used as reflector 13.
b. FIGS. 5A and 5B illustrate examples with current apertures 7, in which a transparent contact geometry is realized such that light is extracted through the TCN layer 5. This can contribute to achieving very high transparency and homogeneous current spreading over the p-layer (first layer 1) grown by MOVPE. FIG. 5A illustrates a case with a non-conductive substrate 18a, FIG. 5B with a conductive substrate 18*b*. Current aperture stop 6 can be, but need not be present.

Figure 6:
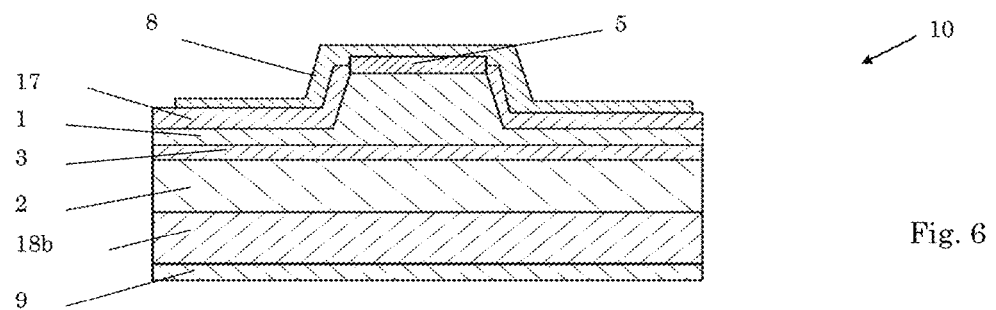
FIG. 6 a ridge waveguide laser diode device.
Figure 7:
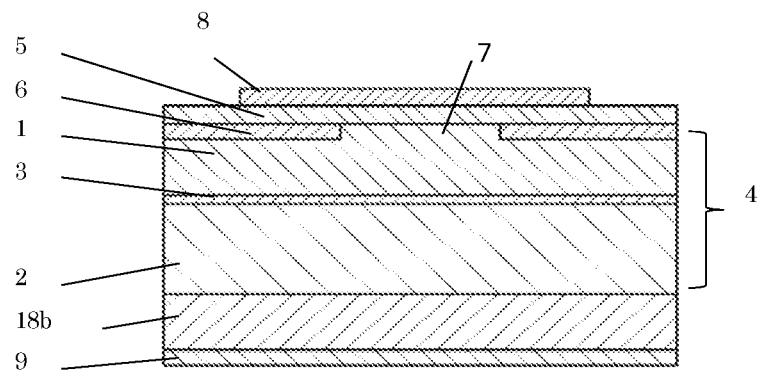
FIG. 7 a stripe injection gain-guided laser device.
Figure 8:
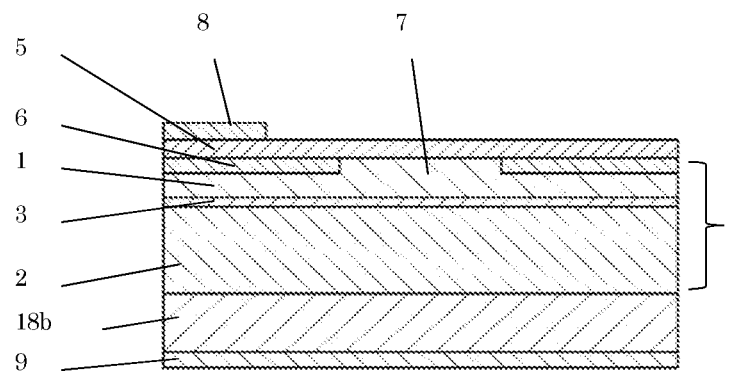
FIG. 8 an air-cladding laser device.

Edge-Emitting Laser Diode or Optical Amplifier or Superluminescent Diode a. FIG. 6 illustrates a ridge waveguide laser diode device 10. The TCN layer 5 can contribute to minimizing the resistance of the p-side metallic contact 8 used to inject current into the active region 3. A dielectric 17 is provided. The direction of light emission is perpendicular to the drawing plane.

b. FIG. 7 illustrates a stripe injection gain-guided laser device 10. The TCN layer 5 can contribute to minimizing the resistance to the metallic contact 8. And it can contribute to making the current injection uniform over a stripe-shaped region. The stripe region can be defined by standard fabrication techniques in the p-i-n structure grown by MOVPE before the deposition of the TCN layer 5.

c. FIG. 8 illustrates an air-cladding laser device 10. The TCN layer 5 is used in this case as a current spreading layer in a p-i-n laser structure 4 designed for a large penetration of the optical mode towards the p-side. The inset illustrates the modal intensity I as a function of the coordinate −z. The interface between air and the TCN layer 5 squeezes the laser mode back into the active region 3 and can contribute to maximizing the optical confinement. A stripe region can be defined by standard fabrication techniques in the p-i-n structure grown by MOVPE before the deposition of the TCN layer 5.

Figure 9:
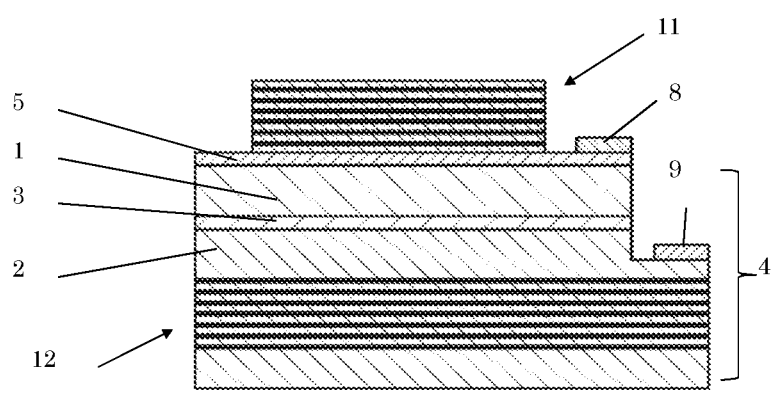
FIG. 9 a VCSEL device.

Vertical Cavity Surface Emitting Laser a. FIG. 9 illustrates a VCSEL device 10 in which the TCN layer 5 is used as a current spreading layer to achieve efficient intracavity injection of the VCSEL active region 3. It can be of advantage for the operation of the VCSEL when the TCN layer has a high transparency (such as more than 99%). A current aperture (not illustrated in FIG. 9) can be defined by standard fabrication techniques in the p-i-n structure 4 grown by MOVPE before the deposition of the TCN layer 5. Reflectors 11, 12 are provided.

Manufacturing Details and Further Embodiments

Figure 10:
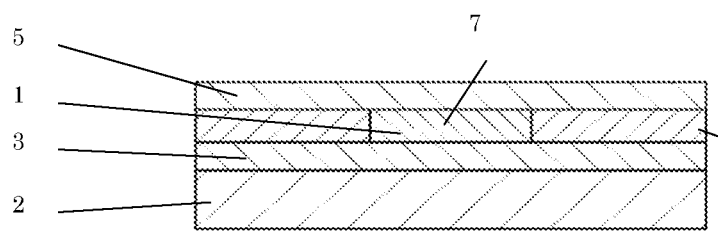
FIG. 10 a device in which the current aperture stop extends from the TCN layer to the active region of the semiconductor structure.

In several examples above with a current aperture stop 6, the first layer 1 extends below the current aperture stop 6. However, this needs not be the case, neither in the embodiments above, nor in those below. In FIG. 10, an embodiment is illustrated in which a thickness of the current aperture stop 6 is identical to a thickness of the first layer 1. While in illustrated embodiments above, only a portion of the first layer 1 is present in the lateral area defined by the current aperture 7, in FIG. 10, the whole first layer is present in the lateral area defined by the current aperture 7.

Figure 11A:
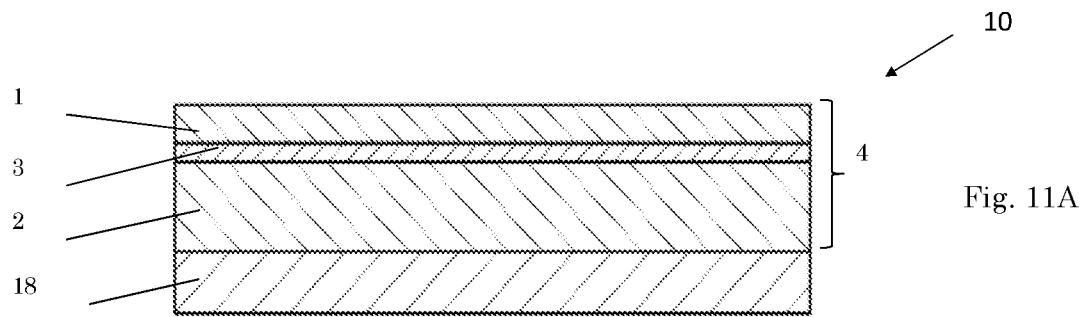
FIG. 11A a semiconductor structure on a substrate.
Figure 11B:
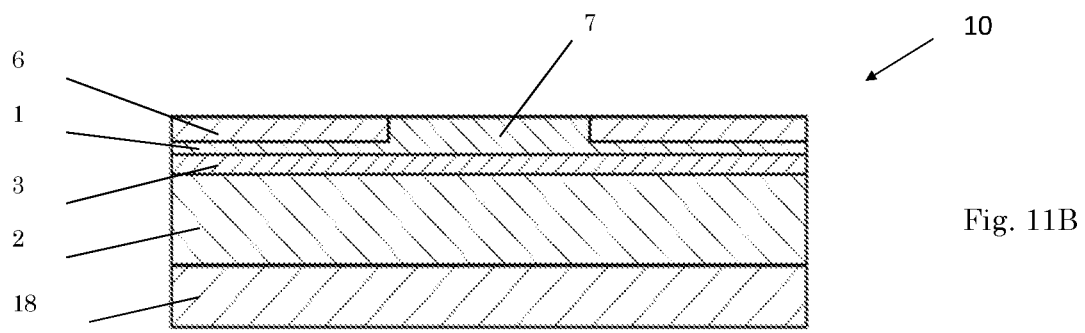
FIG. 11B the semiconductor structure of FIG. 11A with a current aperture in the first layer.
Figure 11C:
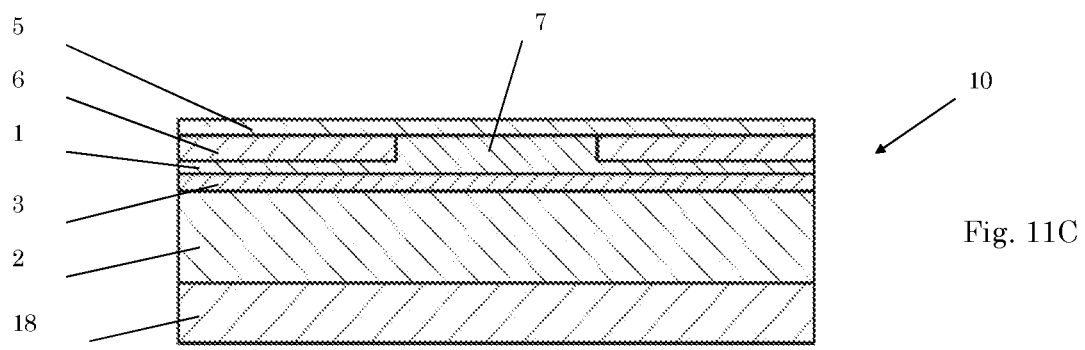
FIG. 11C a device obtained from the semiconductor structure of FIGS. 11A, 11B by applying the TCN layer across the current aperture and a portion of the first layer.

FIGS. 11A, 11B, 11C illustrate method steps for manufacturing a device 10.

Initially provided/manufactured is the semiconductor structure 4 (which also can be considered the body of the light emitting device 10). An example is illustrated in FIG. 11A. It includes one or more light emitting layers that are sandwiched between doped layers 1, 2 of different type. P-type layers can be above, towards the surface of the device. N-type layers can be below, in between the light emitting layers and an optional substrate 18. Substrate 18 can be, e.g., free-standing III-nitride (e.g., GaN), sapphire, Silicon, SiC. It may include reflectors, in particular optical reflectors having a high reflectivity such as Bragg reflectors In FIG. 11A, i-layer 3 represents the active region of the semiconductor structure 4.

In a next step, one or more current aperture stops 6 can be produced (cf. FIG. 11B), in particular in the semiconductor structure 4 and even more specifically in the first layer 1. As illustrated in FIG. 11B, a current aperture 7 can be located within the top p-layer 1. Current aperture 7 can have lower resistivity than the surrounding areas, i.e. than the current aperture stop 6. In the current aperture stop, conductivity due to the p-type dopant can be, e.g., compensated by the presence of other impurities of different type, i.e. of n-type, like for example Si, Oxygen, Titanium, Carbon. Or the p-type dopant (Mg) can be passivated by Hydrogen, in order to form the current aperture stop in the first layer 1.

A current aperture stop 6 can also be considered a current confining area or current confining structure or current blocking structure.

In a next step (cf. FIG. 11C), the TCN layer 5 is applied on top. The p-i-n structure 4 (more specifically a portion of the first layer 1) and the current aperture stop 6 are overgrown by the TCN layer, and thus by a transparent highly n-type or p-type doped III-layer (the group-III elements being one or more of Al, In, Ga). The TCN layer 5 minimizes the resistance to metallic layers that can be deposited thereabove. And it can also provide a tunnel junction at the interface with the uppermost layer (first layer 1) for efficient current injection through the non-resistive current apertures, in case the TCN layer 5 is n-type doped and the first layer is p-type doped or vice versa.

The body of the light emitting device (semiconductor structure 4, cf. FIG. 11A) can be made by, e.g., MOCVD or MBE.

The current aperture 7 can be formed, e.g., from a first layer 1 which is a resistive p-layer, by decreasing the resistivity in local areas (where the current aperture shall be located), e.g., by removal of a type of impurities (like for example Hydrogen or Oxygen impurities that are present in the layer together with the Mg).

Or, the current aperture can be formed, e.g., from a low-resistivity first layer which is a p-layer, by increasing the resistivity in local areas (where the current aperture stop shall be located), by the introduction of doping species of different type (i.e. n-type, like Si, $O_2$, Ti, C), or by locally passivating the p-type Mg with Hydrogen.

The highly doped TCN layer 5 (e.g., n-type doped; or p-type doped) can be epitaxially deposited by MBE. In case of an n-doped TCN-layer 5, this can result in an efficient tunnel junction at the interface with the uppermost p-layer.

Some details of exemplary current aperture stops:

The current aperture seen from the top of the wafer (i.e. in vertical direction) can have, e.g., a circular or rectangular shape.

a. Circular: diameter can be, e.g., between 2 µm and 100 µm;

b. Rectangular: Dimension in x: can be, e.g., between 2 µm and 100 µm; and dimension in y: can be, e.g., between 2 µm and 2000 µm A device can include several current apertures. E.g., a current aperture can be repeated several times within a single device, e.g., to produce linear or 2D current aperture arrays.

The thickness t (along the vertical axis) of the current aperture stop 6 (resistive region) can be, e.g., between 10 nm and 1 µm or between 10 nm and the full thickness of the first layer. Its thickness can be dependent on the method used for creating the current aperture stop:
  a. Selective Mg activation: Thickness t can be identical with the full thickness of the first layer 1
  b. Local passivation by mask and annealing: e.g., 50 nm<t<500 nm
  c. Local passivation by plasma treatment: e.g., 5 nm<t<100 nm
  d. Resistive region created by deposition (e.g., regrowth), such as after etching: e.g., 10 nm<t<full thickness of the first layer 1.

In the following, some ways for producing a current aperture stop will be briefly described (first layer p-doped with Mg assumed).

1. Selective activation by mask deposition and annealing:
   Mask selectively deposited only over regions outside current aperture 7. Mask can be made of, e.g., SiN, or $SiO_2$.
   Mg activation by thermal annealing: T>450° C.
   Removal of mask
2. Selective passivation by mask deposition and annealing:
   Mg activation under thermal annealing, e.g., at above >450° C.
   Mask selectively deposited only over regions where resistivity will be increased, i.e., where current aperture stop 6 shall be created. Mask can be made of, e.g., SiN, or $SiO_2$ or Ti.
   Annealing, e.g., at temperature 100° C.<T<450° C.
   Removal of mask
3. Local passivation by plasma treatment:
   Mg activation under thermal annealing, e.g., at above >450° C.
   Mask selectively deposited (e.g., a photoresist material) to protect current aperture region.
   Plasma treatment: plasma power supply typically in the 50 V to 500 V range. Pressure: 1<p<100 mTorr. Possible atomic species in the plasma: one of more of H, O, C, Si, Cl, Ar
   Removal of mask
4. Resistive region created by etching and regrowth:
   Mg activation under thermal annealing, e.g., at above >450° C.
   Mask selectively deposited to protect current aperture region.
   Etching down exposed surface to a desired thickness, e.g., by ion etching techniques including Cl atoms
   Regrowth of, e.g., codoped (Mg and Si dopants), resistive region(s), e.g., by MBE
   Removal of mask In all above cases, deposition of the TCN layer can take place after removal of the mask.

Some further exemplary details of devices 10 (cf., e.g., FIG. 3; but the details apply also if a current aperture stop 6 is present):
  The substrate 18 is suited for epitaxial growth of an AlInGa—N compound, and is, e.g., bulk GaN (thickness between 0.2 mm and 1 mm) or sapphire (thickness between 0.2 mm and 1 mm). In the case of bulk GaN, the substrate is, e.g., n-doped with Si or O impurities as dopant.
  The second layer 2 can be made of a III-nitride crystal and e.g., can contain any possible combination of the group-III elements Al, Ga, In. The composition can change along the vertical axis to create desired effects, e.g., for improving light confinement and/or to optimize current injection towards the active region 3 and/or for improved structural strain management.
  The second layer 2 can be, e.g., n-doped with Si. The doping level can vary over the vertical axis, and is typically lower closer to the active region 3 (e.g., between $1 \cdot 10^{17}/cm^3$ and $1 \cdot 10^{18}/cm^3$) and higher towards the substrate (e.g., more than $1 \cdot 10^{18}/cm^3$). The thickness of the second layer 2 can depend on the device geometry. It can be, e.g., between 0.2 μm and 5 μm.
  The active region 3 is typically non intentionally doped (n.i.d.) and can be made of or at least comprise quantum wells, such as lower band-gap III-nitride crystal material (such as one or multiple nitride layers containing In and Ga and Al) embedded in a larger bandgap group-III-nitride crystal material acting as a barrier (such as one or multiple III-nitride layers containing In and Ga and Al). The thickness of the active region 3 can depend on the device geometry. It can be, e.g., between 2 nm and 500 nm.
  The first layer 1 can be made of a III-nitride crystal and e.g., can contain any possible combination of the group-III elements Al, Ga, In. The composition can change along the vertical axis to create desired effects, e.g., for improving light confinement and/or to optimize current injection towards the active region 3 and/or for improved structural strain management.
  The first layer 1 can be, e.g., p-doped with Mg. The doping level can vary over the vertical axis, and can be lower closer to the active region 3 (e.g., between $1 \cdot 10^{18}/cm^3$ and $5 \cdot 10^{18}/cm^3$) and higher towards the substrate (e.g., more than $5 \cdot 10^{18}/cm^3$ and can be lower than $2 \cdot 10^{20}/cm^3$). The thickness of the first layer 1 can depend on device geometry. It can be, e.g., between 0.05 μm and 1 μm.
  The semiconductor structure 4 (body of the light emitting device), being the total of first layer 1 plus active region 3 plus second layer 2 can be epitaxially grown by Metal Organic Vapour Phase Epitaxy (MOVPE) or MOCVD (Metal Organic Chemical Vapor Deposition).
  The transparent layer 5 (Transparent Conductive Nitride layer, TCN layer) is in contact with the first layer 1 and can be grown by MBE. It can be highly n-doped, e.g., with Si. Typical n-doping levels can be between $1 \cdot 10^{18}/cm^3$ and $5 \cdot 10^{20}/cm^3$. The dopant concentration can vary along the vertical axis. Typical thickness t of the TCN layer 5 can depend on the device geometry and amount to, e.g., between 30 nm and 300 nm.

Summarizing some points of the described devices and methods, we note that MOVPE can make possible to produce III-nitride based semiconductor structures of excellent crystal quality capable of high light emission efficiency, but Mg atoms (as p-dopant) are passivated by hydrogen such that as-grown structures have a high resistivity (in the p-doped layer). The hydrogen can be removed by annealing above about 400° C., resulting in a good conductivity. But due to relatively low hole mobility in an (activated) Mg-doped first layer, lateral current injection is problematic (because of still relatively high resistivity), and producing ohmic contacts of low resistance on the first layer is problematic, too. The deposition of the transparent layer 5 (TCN layer) can contribute to achieving a good lateral current spreading and low-resistance ohmic contacts.

Provision of current aperture stops, e.g., as described, can provide the effects as described. It can be produced in a way that it is epitaxial with the first layer, cf. above.

With or without current aperture stop 6, the transparent (TCN) layer can be grown without exposing the first layer 1 to hydrogen, e.g. when using MBE. Epitaxial deposition of the transparent layer 5 (on the first layer 1) can result in low resistances at the interface to the first layer and to low resistivity in the transparent layer 5. And in case a current aperture stop 6 is present, epitaxial deposition of the transparent layer (on the current aperture stop) can result in low resistances at the interface to the current aperture stop 6.

And the interfaces of the transparent layer to the first layer and to the current aperture stop can both be planar and lie both in one and the same (lateral) plane.

High doping levels of the transparent layer, e.g., with Si as dopant, can result in excellent electrical properties.

The foregoing description and accompanying drawings illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A method for manufacturing a light-emitting semiconductor device, the method comprising: depositing an n-type layer composed of a nitride of at least one group-III element; depositing a p-type layer over the n-type layer, the p-type layer composed of a nitride of at least one group-III element; and depositing a transparent, current spreading layer on the p-type layer, the transparent, current spreading layer being n-type and composed of a nitride of at least one group-III element, the transparent, current spreading layer being configured to be transparent to light emitted from the light-emitting semiconductor structure and of sufficiently high electrical conductivity to provide lateral spreading of injection current for the light-emitting semiconductor structure within the transparent, current spreading layer; and producing a current aperture stop between the transparent, current spreading layer and the p-type layer from a part of the p-type layer by effecting a diffusion of foreign atoms locally into the p-type layer to increase the local resistivity of said part of the p-type layer.

2. The method according to claim 1, wherein the n-type layer is deposited using metal organic vapor phase epitaxy.

3. The method according to claim 1, wherein as deposited the p-type layer has passivated dopants, the method further comprising activating said passivated dopants in at least a portion of the p-type layer.

4. The method according to claim 3, wherein the passivated dopants are activated in said portion of the p-type layer by applying a local heat treatment.

5. The method according to claim 1, wherein the current aperture stop has a resistivity amounting to at least 10 times a resistivity of the p-type layer.

6. The method according to claim 1, wherein effecting the diffusion of the foreign atoms locally into the p-type layer comprises: depositing on the p-type layer, in a lateral area where the current aperture stop is to be produced, a diffusion-promoting mask containing the foreign atoms; and effecting the diffusion of the foreign atoms into the p-type layer by applying a heat treatment.

7. The method according to claim 1, wherein effecting the diffusion of the foreign atoms locally into the p-type layer comprises: depositing on the p-type layer, in a lateral area where the current aperture is to be produced, a diffusion-inhibiting mask; and applying a plasma containing the foreign atoms to diffuse into the p-type layer.

8. The method according to claim 1, wherein the p-type layer is doped with Mg as a p-type dopant.

9. The method according to claim 1, wherein the electrical conductivity of the transparent, current spreading layer exceeds the electrical conductivity of the p-type layer by at least a factor of 10.

10. The method according to claim 1, wherein a point defect density in the transparent, current spreading layer is at least one of: above $5\times10^{19}$/cm3; between $5\times10^{19}$/cm3 and $1\times10^{21}$/cm3; and between $5\times10^{19}$/cm3 and $5\times10^{20}$/cm3.

11. The method according to claim 1, wherein the at least one group-III element is at least one of: Ga, Al and In.

12. The method according to claim 1, wherein the n-type layer is doped n-type with at least one of Si, O and Ge.

13. The method according to claim 1, wherein the transparent, current spreading layer is doped n-type with at least one of Si, O and Ge.

14. The method according to claim 1, wherein the light-emitting semiconductor device is an edge emitting semiconductor device.

15. The method according to claim 14, wherein the edge emitting semiconductor device is one of: an edge emitting laser diode, optical amplifier, a superluminescent diode and a light emitting diode.

16. The method according to claim 1, wherein the light-emitting semiconductor device is one of a vertical cavity surface emitting laser and a resonant cavity light emitting diode.

17. The method according to claim 1, wherein the p-type layer is deposited using metal organic vapor phase epitaxy and the transparent, current spreading layer is deposited using molecular beam epitaxy.

18. The method according to claim 1, further comprising a non-intentionally doped layer arranged between the n-type layer and the p-type layer.

* * * * *